US006959426B2

(12) United States Patent
Xiang et al.

(10) Patent No.: US 6,959,426 B2
(45) Date of Patent: Oct. 25, 2005

(54) COST-EFFECTIVE SCAN ARCHITECTURE AND A TEST APPLICATION SCHEME FOR SCAN TESTING WITH NON-SCAN TEST POWER AND TEST APPLICATION COST

(75) Inventors: Dong Xiang, Beijing (CN); Jiaguang Sun, Beijing (CN); MingJing Chen, Beijing (CN); Shan Gu, Beijing (CN)

(73) Assignee: Tsinghua University, Beijing (CN)

( * ) Notice: Subject to any disclaimer, the term of this patent is extended or adjusted under 35 U.S.C. 154(b) by 0 days.

(21) Appl. No.: 10/741,457

(22) Filed: Dec. 19, 2003

(65) Prior Publication Data

US 2004/0153978 A1 Aug. 5, 2004

(30) Foreign Application Priority Data

Dec. 30, 2002 (CN) .......................... 02159931 A

(51) Int. Cl.[7] .............................................. G06F 17/50
(52) U.S. Cl. .................................. 716/3; 716/4; 716/5
(58) Field of Search ........................................ 716/1–6

(56) References Cited

U.S. PATENT DOCUMENTS

| 5,703,789 | A | * | 12/1997 | Beausang et al. | ............... 716/4 |
| 5,828,579 | A | * | 10/1998 | Beausang | ....................... 716/2 |
| 6,106,568 | A | * | 8/2000 | Beausang et al. | ............. 716/18 |
| 6,195,776 | B1 | * | 2/2001 | Ruiz et al. | ................... 714/738 |

OTHER PUBLICATIONS

Nicola Nicolici, "Multiple Scan chains for Power Minimization during Test Application in Sequential Circuit" IEEE, Jun. 2002, pp 721–734.*
Samy et al, "Iddq Test Pattern Generation for Scan Chain Latches and Flip–Flops" IEEE, 1997, pp 2–6.*
Kuen–Jong Lee et al., "Using a Single Input to Support Multiple Scan Chains", Dept. of E.E., pp. 74–78.

Soo Young Lee et al., "Test Application Time Reduction for Sequential Circuits with Scan", 1995 IEEE vol. 14, No. 9, pp. 1128–1140.
Ilker Hamzaogly et al., "Reducing Test Application Time for Full Scan Embedded Cores", Center for Reliable & High Performance Computing; 8 pages.
Sridhar Narayanan et al., "Reconfiguration Techniques for a Single Scan Chain", 1995 IEEE vol.,. 14, Nos. 6, pp. 750–765.
Hideo Fujiwara et al., "Parity–Scan Design to Reduce the Cost of Test Application", 1992 IEEE, pp. 283–292.
Sridhar Narayanan et al., "Optimal Configuring of Multiple Scan Chains", 1993 IEEE, pp. 1121–1131.
Nicola Nicolici et al., "Multiple Scan Chains for Power Minimization During Test Application in Sequential Circuits", IEEE Jun. 2002, vol. 51, No. 6, ps. 721–734.

(Continued)

Primary Examiner—Vuthe Siek
Assistant Examiner—Binh Tat
(74) Attorney, Agent, or Firm—Schmeiser, Olsen & Watts

(57) ABSTRACT

A method and apparatus for scan design architecture with non-scan testing cost is disclosed. In one embodiment, the method comprises: transforming a plurality of sequential cells for a sequential circuit to a plurality of controllable and observable cells for a combinational circuit; connecting said plurality of sequential cells with at least one shifter registers; obtaining at least one scan chains; and substituting the ATPG step for said sequential circuit with the ATPG for said combinational circuit. In another embodiment, the apparatus comprises: means for transforming a plurality of sequential cells for a sequential circuit to a plurality of controllable and observable cells for a combinational circuit; means for connecting said plurality of sequential cells with at least one shifter registers; means for obtaining at least one scan chains; and means for substituting the ATPG step for said sequential circuit with the ATPG for said combinational circuit.

4 Claims, 7 Drawing Sheets

OTHER PUBLICATIONS

Dong Xiang et al., Handling the Pin Overhead Problem of DFTs for High-Quality and At-Speed Tests, 2002 IEEE, vol. 21, No. 9, pg.s 1105–1113.

Dhiraj K. Pradhan et al., "A Novel Scheme to Reduce Test Application Time in Circuits with Full Scan", 1995 IEEE, vol. 14, No. 12, pp. 1577–1585.

Dong Xiang et al., "A Multiple Phase Partial Scan Design Method" 2001 IEEE, pp. 17–22.

Hsu et al., "A Case Study on the Implementation of the Illinois Scan Architecture", 2001 IEEE pp. 538–547.

* cited by examiner

Table 1: Experiment Results for ISCAS89 Circuits with Full Scan Forest Design

| Circuit | Full scan | | | No xor-tree | | scanforest | | | | | | | | |
|---|---|---|---|---|---|---|---|---|---|---|---|---|---|---|
| | FC(%) | #red | VEC | FC(%) | #red | FC(%) | #red | VEC | TA(%) | PTP(%) | TP(%) | PO | ao(%) | $A_1$ |
| s420 | 100 | 0 | 166 | 100 | 0 | 100 | 0 | 250 | 17.65 | — | 13.35 | 2 | 13.47 | 0 |
| s641 | 100 | 0 | 152 | 100 | 0 | 100 | 0 | 196 | 12.85 | — | 15.91 | 2 | 10.96 | 0 |
| s713 | 93.46 | 38 | 148 | 94.84 | 38 | 95.08 | 38 | 190 | 12.79 | — | 14.45 | 2 | 10.61 | 0 |
| s838 | 100 | 0 | 342 | 100 | 0 | 100 | 0 | 521 | 9.22 | — | 6.81 | 2 | 13.51 | 0 |
| s953 | 100 | 0 | 212 | 100 | 0 | 100 | 0 | 446 | 13.98 | — | 6.81 | 2 | 14.56 | 0 |
| s1196 | 100 | 0 | 378 | 100 | 0 | 100 | 0 | 410 | 11.40 | — | 11.58 | 2 | 7.27 | 0 |
| s1238 | 94.91 | 69 | 384 | 95.40 | 69 | 95.50 | 69 | 434 | 11.88 | — | 12.38 | 2 | 7.19 | 0 |
| s1423 | 99.08 | 14 | 178 | 99.31 | 14 | 99.31 | 15 | 348 | 12.99 | 6.99 | 14.71 | 2 | 16.86 | 1 |
| s5378 | 99.13 | 40 | 590 | 99.32 | 40 | 99.36 | 40 | 959 | 2.71 | 1.51 | 1.90 | 2 | 13.60 | 0 |
| s9234 | 93.68 | 438 | 1118 | 94.67 | 452 | 95.20 | 438 | 2129 | 4.99 | 1.90 | 2.79 | 5 | 6.13 | 0 |
| s9234.1 | 93.47 | 452 | 1087 | 94.67 | 452 | 94.89 | 452 | 2075 | 3.60 | 1.54 | 2.59 | 2 | 8.83 | 0 |
| s13207 | 98.47 | 150 | 1190 | 98.94 | 152 | 99.07 | 153 | 1780 | 1.34 | 0.77 | 0.97 | 9 | 13.38 | 1 |
| s13207.1 | 98.46 | 149 | 1146 | 98.94 | 152 | 99.07 | 153 | 1788 | 1.42 | 0.63 | 0.82 | 2 | 12.16 | 1 |
| s15850 | 96.64 | 390 | 1090 | 97.43 | 393 | 97.62 | 406 | 2093 | 1.85 | 0.93 | 1.41 | 9 | 10.20 | 13 |
| s15850.1 | 96.67 | 390 | 1090 | 97.43 | 393 | 97.62 | 395 | 2153 | 1.11 | 0.48 | 0.93 | 2 | 9.98 | 2 |
| s38417 | 99.44 | 176 | 2712 | 99.59 | 180 | 98.75 | 581 | 2717 | 0.31 | 0.28 | 0.26 | 2 | 15.20 | 401 |
| s38584 | 95.85 | 506 | 1718 | 96.66 | 1508 | 96.86 | 1512 | 4007 | 0.80 | 0.81 | 0.89 | 9 | 12.10 | 4 |
| s38584.1 | 95.85 | 506 | 1718 | 96.66 | 1508 | 96.86 | 1508 | 3745 | 0.76 | 0.39 | 0.70 | 2 | 13.62 | 0 |
| s1269 | 100 | 0 | 114 | 100 | 0 | 100 | 0 | 264 | 18.17 | 5.77 | 14.07 | 2 | 11.49 | 0 |
| s1512 | 100 | 0 | 212 | 100 | 0 | 100 | 0 | 353 | 8.59 | 3.43 | 5.79 | 2 | 13.90 | 0 |
| s3271 | 100 | 0 | 256 | 100 | 0 | 99.87 | 6 | 628 | 4.18 | 1.34 | 2.49 | 2 | 13.03 | 6 |
| s3330 | 100 | 0 | 704 | 99.36 | 24 | 99.40 | 24 | 954 | 4.07 | 2.69 | 3.59 | 2 | 13.62 | 0 |
| s3384 | 100 | 0 | 240 | 100 | 0 | 100 | 0 | 335 | 2.27 | 1.31 | 1.64 | 2 | 16.62 | 0 |
| s4863 | 100 | 0 | 132 | 100 | 0 | 100 | 0 | 341 | 4.89 | 1.54 | 2.83 | 2 | 7.61 | 0 |
| s6669 | 100 | 0 | 124 | 100 | 0 | 100 | 0 | 335 | 2.24 | 1.51 | 1.90 | 2 | 12.30 | 0 |

Table 2: Experimental Results for ISCAS89 Circuits with Partial Scan Forest Design

| Circuit | Partral scan design | | | | No xor-tree | | pscanforest | | | | | | | | |
|---|---|---|---|---|---|---|---|---|---|---|---|---|---|---|---|
| | FC(%) | #HF | VEC | sff | FC(%) | #HF | FC(%) | #HF | VEC | TA(%) | TP(%) | PTP(%) | po | ao(%) | $A_1$ |
| S1423 | 97.49 | 38 | 444 | 44 | 96.43 | 65 | 96.20 | 72 | 403 | 6.04 | 18.65 | 22.49 | 2 | 9.48 | 7 |
| S5378 | 98.81 | 55 | 863 | 120 | 98.89 | 61 | 98.92 | 62 | 1327 | 3.80 | 11.44 | 8.22 | 2 | 9.43 | 1 |
| S9234 | 93.47 | 452 | 1087 | 211 | 94.67 | 452 | 94.89 | 323 | 2075 | 3.60 | 2.11 | — | 2 | 8.83 | 0 |
| S9234.1 | 93.47 | 452 | 1087 | 211 | 94.67 | 452 | 95.05 | 453 | 2232 | 3.87 | 2.59 | 1.54 | 2 | 6.61 | 0 |
| S13207 | 96.76 | 318 | 1722 | 400 | 97.45 | 319 | 97.56 | 324 | 2241 | 1.29 | 4.36 | — | 2 | 9.87 | 5 |
| S13207.1 | 96.76 | 318 | 1722 | 400 | 97.63 | 319 | 97.56 | 323 | 2241 | 1.29 | 4.45 | 3.88 | 2 | 9.66 | 4 |
| S15850 | 95.29 | 543 | 1191 | 400 | 96.17 | 545 | 96.37 | 545 | 2121 | 1.33 | 3.86 | — | 2 | 9.09 | 0 |
| S15850.1 | 95.29 | 543 | 1191 | 400 | 96.17 | 545 | 96.37 | 545 | 2121 | 1.33 | 4.1 | 2.94 | 2 | 9.09 | 0 |
| S35932 | 89.81 | 3984 | 493 | 306 | 90.27 | 3984 | 90.41 | 3984 | 1115 | 1.47 | 12.35 | 8.65 | 2 | 3.20 | 0 |
| S38417 | 98.80 | 368 | 3331 | 1069 | 98.91 | 416 | 98.82 | 475 | 5670 | 0.95 | 2.45 | 2.35 | 2 | 9.23 | 107 |
| S38584.1 | 95.85 | 1506 | 2143 | 1040 | 95.89 | 1730 | 96.31 | 1731 | 5068 | 1.70 | 3.25 | 2.64 | 2 | 9.52 | 1 |
| S1269 | 99.85 | 2 | 151 | 20 | 99.86 | 2 | 99.88 | 2 | 330 | 20.71 | 48.05 | 27.39 | 2 | 6.12 | 0 |
| S1512 | 100 | 0 | 196 | 37 | 100 | 0 | 100 | 0 | 322 | 8.61 | 23.99 | 20.79 | 2 | 8.82 | 0 |
| S3271 | 99.94 | 2 | 376 | 80 | 99.82 | 7 | 99.81 | 8 | 607 | 3.97 | 8.81 | 5.77 | 2 | 9.49 | 1 |
| S3330 | 98.61 | 40 | 704 | 100 | 97.53 | 88 | 97.65 | 88 | 860 | 3.62 | 13.02 | 10.54 | 2 | 9.96 | 0 |
| s3384 | 99.23 | 26 | 473 | 110 | 98.55 | 66 | 98.55 | 66 | 517 | 1.96 | 5.14 | 6.62 | 2 | 9.69 | 0 |
| S4863 | 100 | 0 | 182 | 40 | 100 | 0 | 100 | 0 | 306 | 8.17 | 31.27 | 31.52 | 2 | 2.36 | 0 |
| S6669 | 99.99 | 1 | 180 | 180 | 99.99 | 1 | 99.99 | 1 | 347 | 2.72 | 8.77 | 4.94 | 2 | 9.52 | 0 |

COST-EFFECTIVE SCAN ARCHITECTURE AND A TEST APPLICATION SCHEME FOR SCAN TESTING WITH NON-SCAN TEST POWER AND TEST APPLICATION COST

FIELD OF THE INVENTION

The present invention relates generally to IC testing and design for testability. In particular, the present invention relates to a cost-effective scan architecture and test application scheme for scan testing with non-scan test power consumption and test application cost.

BACKGROUND OF THE INVENTION

Scan design is a method of structural design for testability for sequential circuits. This method changes the flip-flops in the circuit into controllable and observable ones, and connects the flip-flops into one or more shift registers to construct one or more scan chains. Using full scan design, one can convert sequential circuit test generation into combinational circuit test generation, and can drastically decrease the test generation cost and complete fault coverage. Thus, scan design is the most popular technique used in industry and academy. However, scan design increases the test application cost and test power consumption drastically. Some methods have been proposed to reduce test application cost and test power consumption for scan design, but none of those methods can obtain satisfactory results. Currently those methods includes:

(1) ordering test vectors or scan flip-flops. For example, the parity scan testing scheme proposed by Fujiwara. The methods can decrease the test application cost to a certain extent. However, test application cost may still be very high. Along with the increasing IC size, the test application time will be very long and these methods are unable to handle the problem.

(2) parallel scan. The method can decrease the test application time, but it brings to the problem of pin overhead. If we construct k scan chains in the circuit, we will have to use 2k+1 extra pins to input the scan pattern.

(3) controlling multiple scan chains by a single scan-in signal can reduce the test application time of system on a chip (SOC) to a great extent, but the test application time and test power of this method are still much greater than those of non-scan method.

(4) driving multiple scan chains with a single scan-in signal can reduce the test application time greatly, but it brings to an obvious degradation on fault coverage.

(5) using hybrid test generation algorithms to reduce test application cost. Experiments have proved that all these methods' contribution in reducing test application time is very limited.

Thus, how to decrease the test cost of scan design while remaining complete fault coverage has become an imminent problem and need to be solved as soon as possible.

SUMMARY OF THE INVENTION

A method and apparatus for scan design architecture with non-scan testing cost is disclosed. In one embodiment, the method comprises: transforming a plurality of sequential cells for a sequential circuit to a plurality of controllable and observable cells for a combinational circuit; connecting said plurality of sequential cells with at least one shifter registers; obtaining at least one scan chains; and substituting the ATPG step for said sequential circuit with the ATPG for said combinational circuit. In another embodiment, the apparatus comprises: means for transforming a plurality of sequential cells for a sequential circuit to a plurality of controllable and observable cells for a combinational circuit; means for connecting said plurality of sequential cells with at least one shifter registers; means for obtaining at least one scan chains; and means for substituting the ATPG step for said sequential circuit with the ATPG for said combinational circuit.

Other features and advantages of the present invention will be apparent from the accompanying drawings and from the detailed description, which follows below.

BRIEF DESCRIPTION OF THE DRAWINGS

The present invention is illustrated by way of example and not intended to be limited by the figures of the accompanying drawings in which like references indicate similar elements and in which.

Table 1 and table 2 show the test pattern generation results of ISCAS89 circuits with full scan forest implementation and partial scan forest implementation respectively.

DETAILED DESCRIPTION OF THE DRAWINGS

A cost-effective scan architecture and a test application scheme for scan testing with non-scan test power and test application cost is disclosed.

The process to construct the scan forest is that to construct the scan trees driven by the primary inputs. First of all, all the scan flip-flops are grouped according to the rule that every two scan flip-flops in the same group do not converge in the combinational part of the circuit. If two scan flip-flops have one or more common successors (direct or indirect) in the combinational part of the circuit, we can say that they converge in the circuit, thus they cannot be put into the same group; if the two scan flip-flops have no common successor (direct or indirect) in the combinational part of the circuit, we can say that they do not converge in the circuit, thus they can be put into the same group.

The algorithm of grouping the scan flip-flops is shown in the following:

(1) In the beginning, all scan flip-flops in the circuit are not grouped and they constitute a set F ($F=\{f_1, f_2, \ldots f_n\}$);

(2) Create a new empty group $G_i$, and randomly choose one scan flip-flop $f_i$ from F. Add $f_i$ into $G_i$ and delete it from F. $f_i$ is the first member of $G_i$ ($G_i=\{f_i\}$).

(3) Check each of the remaining flip-flops in F whether it converge with any flip-flop in the group. If one flip-flop $f_i$ does not have any common successor with any one scan flip-flop in the current group, add the flip-flop into $G_i$ and delete it from F. A complete group $G_i$ is constructed using the above scheme.

(4) Create a new group $G_{i+1}$, and randomly choose one scan flip-flop from the remaining F as the first member of $G_{i+1}$. Then construct $G_{i+1}$ in the same way described in step (3).

(5) Output the Scan Flip-Flop Groups.

Figure 3:
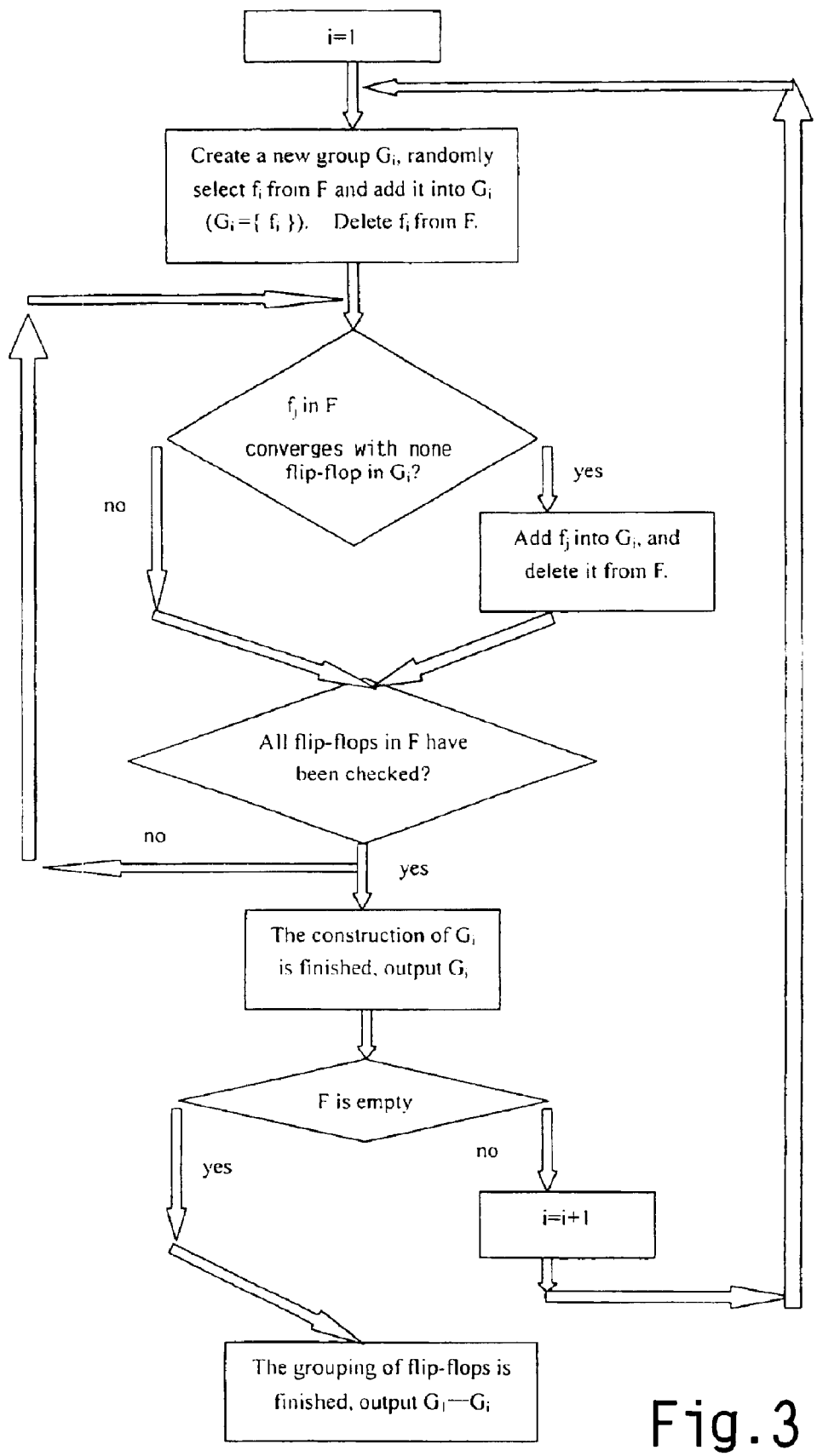
FIG. 3 is a flow chart to construct the scan forest according to one embodiment of the invention.

The flow chart of grouping the scan flip-flops is shown in FIG. 3. After grouping the scan flip-flops, we can construct the scan forest as follows:

When the number of primary inputs k is no smaller than the number of flip-flop groups (supposed to be g), randomly choose g primary inputs and connect all g groups of flip-flops to all g primary inputs, respectively.

When g>k, choose k groups and connect them to all primary inputs, respectively (every primary input can drive only one group of flip-flops), thus construct the first level of the scan forest; then randomly select one flip-flop from every group in the first level as root node of the second level, and choose k groups from the remaining g–k groups, and randomly connect the k root node flip-flops to the k groups, respectively, thus we can establish the second level of scan forest; in the same way, all the remaining groups can be added into the scan forest.

For example, let a circuit have k primary inputs and n scan flip-flops, and after the grouping of the scan flip-flops, we can suppose that there are g groups (g<=n). Then we can speculate the structure of this circuit's "scan forest": there are k groups in every level, and the number of levels can be calculated by equation: level=[g/k] (Square brackets mean to round up the data in it), and the number of internal nodes (flip-flop that drives the next group of flip-flops) can be calculated by equation: nInt=(level−2)*k+[g−(level−1)*k]. The number of leaf nodes (flip-flop that has no successor) can be calculated by equation: nleave=n-nInt.

Figure 1:
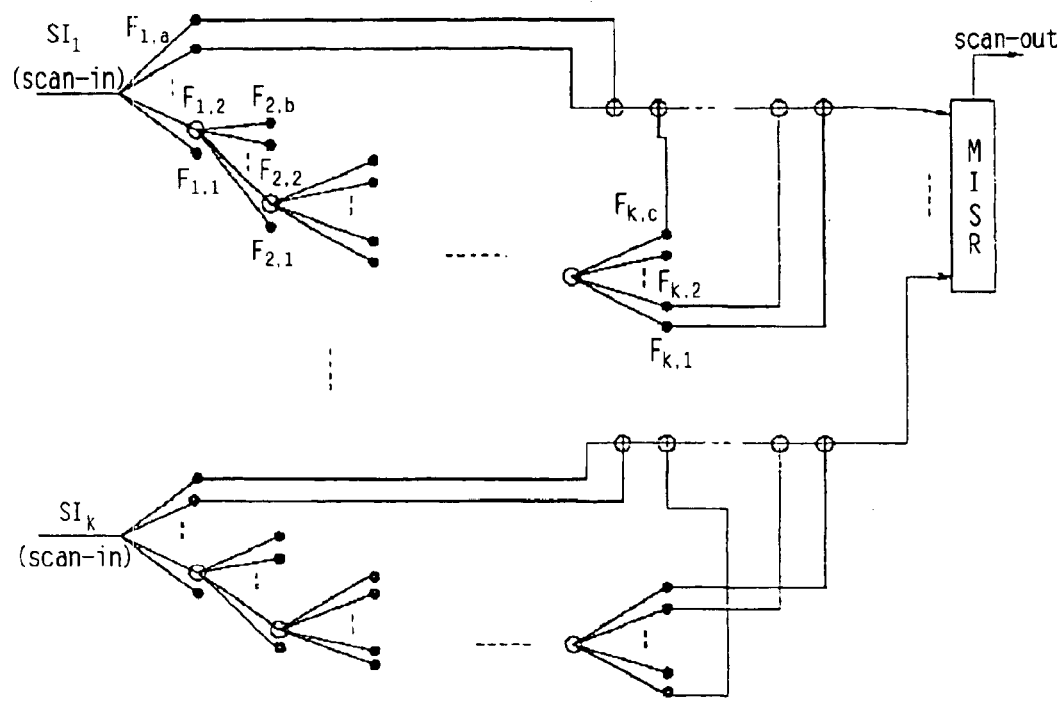
FIG. 1 is a sketch diagram of the scan forest architecture according to one embodiment of the invention, wherein "●" denotes flip-flop at the leaf node and "○" denotes flip-flop at the internal node.
Figure 2:
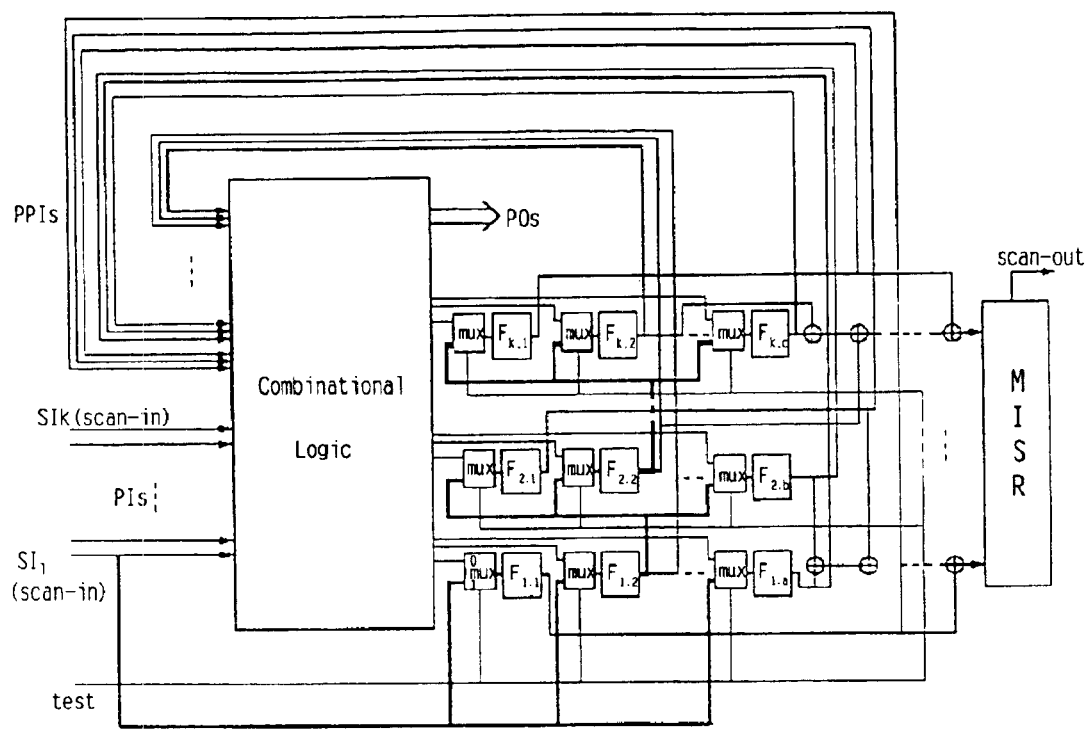
FIG. 2 is a scan design circuit with scan forest structure according to another embodiment of the invention.

After the construction of the scan forest, we can modify the original circuit according to the scan forest to get the scan design circuit as shown in FIG. 2 and then implement test generation on it with an existent tool. The test generator outputs fault coverage and test efficiency, and a set of test vectors. During the process of testing, these test patterns are applied and test responses are obtained. By comparing the actual responses with the expected responses, we know whether the actual circuit is faulty or not. The length of a test pattern is equal to the sum of the number of groups and the number of primary inputs. For a certain group in the scan forest, there is a corresponding value (0 or 1) in the test pattern, that is to say, all scan flip-flops in the group are set to this value.

The procedure of test application can be described as follows:

Set the circuit to test mode, that is to say, set the test signal (shown in FIG. 2) to 1.

At the first clock cycle, the values with respect to the groups at the last level of the scan forest through primary inputs into flip-flops at the first level are applied via the primary inputs. If the number of groups in the last level is smaller than the number of primary inputs, the superfluous primary inputs can be set to any values.

At the second clock cycle, the values for the groups at the last level but one in the scan forest into flip-flops at the first level are applied to the primary inputs and captured at the scan flip-flop groups in at the first level in the scan forest. All values captured at the flip-flop groups at the first level at the last clock are shifted into the scan flip-flops in the second level of the scan flip-flop groups simultaneously.

Similarly, at the "level" (level is the number of levels in the scan forest) clock cycle, the values for groups in the first level are applied to the primary inputs. All values captured at the scan flip-flop groups in other levels are shifted into the next level. All scan flip-flop groups get their own values corresponding to the test vector after this clock cycle. After the values with respect to the primary inputs are applied to the primary inputs, and all values of the scan flip-flop groups are applied to the circuit, all flip-flops capture their own test responses. The circuit is set as the operational mode, that is, the test signal is set as 0 at this time.

When this test cycle ends, the responses of this test pattern are stored in all of the scan flip-flops, that is to say, every scan flip-flop in the scan forest is set to a corresponding response after the clock cycle in which the circuit works as a combinational circuit. Thus the process for applying a test vector has ended, and the whole process needs level+1 clock cycles in which the first level clock cycles are shift cycles (a test pattern is shifted into the scan forest) while the last clock cycle is capture cycle (the test responses are received in the flip-flops). Then set the circuit to test mode again and repeat the above process. When the next test pattern is shifted into the circuit, test responses of last test pattern are shifted out to MISR through the XOR trees.

Full scan design method is to change all flip-flops in the circuit into scan flip-flops as shown in FIG. 2, thus all flip-flops in the circuit are controllable and observable. Full scan design can convert the problem of sequential circuit test generation into that of combinational circuit test generation, which is comparatively simple, and can obtain complete fault coverage. However, though full scan design leads to good fault coverage, expensive area overhead may still be unacceptable because of the XOR trees. This problem can be solved by scanning only a part of all flip-flops. Insertion of scan forest architecture into partial scan designed circuit can lead to fault coverage and test efficiency close to full scan design, while the test application time and power dissipation can be decreased to non-scan design level.

Partial scan design method includes the following steps:

(1) Calculate Testability of the Circuit in Full Scan Design.

The testability of circuit consists of controllability and observability. Let every signal line in the circuit have three optional values: 0, 1 and X (means don't care). The elementary cells of the circuit are NOT gate, NAND gate, NOR gate, AND gate, OR gate and flip-flop. If value v ($v \in \{1,0,X\}$) is assigned to line A, we use the symbol (A, v) to denote it. For a certain gate whose output is line y, if the value of y cannot be confirmed only until all inputs of this gate have been set to v, we call v, non-controlling value of this gate; on the contrary, if any input of this gate is set to controlling value, the value of y can be determined. For example, the controlling and non-controlling values of AND gate is 0 and 1, respectively.

When calculating the testability of the circuit, we have considered the possible conflict between every two lines. Several definitions should be presented first.

Definition 1, if line l must be assigned to value v and value v' at the same clock cycle, l can be assigned properly only if the intersection of v and v' ($v \cap v'$) is not empty; otherwise a conflict generates at line l.

Usually, conflict generates at fan-out of a circuit. When all assignments are necessary, a conflict denotes an undetectable fault here; otherwise, the fault can be detected by backtracking.

Definition 2, the reverse parity of a path in the circuit is equal to the number of inversions in the path module 2. The inversion parity between two lines ($inv_v(A,B)$ ($v \in \{0,1\}$)) is the that of the path from A to B who can satisfy the signal requirement in the easiest way.

The inversion parity from A to B $inv_v(B,A)$ is denoted by one of the four binary digits of two bits: (1)00, (2) 01, (3) 10, (4) 11, which represent (1) there is no path between A and B, or there is no signal requirement at A for the assignment of (B, v); (2) the assignment that is the easiest one to implement from A to B passes only through the paths of odd inversion parities; (3) the assignment that is the easiest one to implement from A to B passes only with even inversion parity; and (4) the assignment that is the easiest one to implement from A to B passes both paths of even and odd inversion parity, respectively.

Definition 3, the sequential depth from fan-out s to line l·$seq_v(l,s)$ ($v \in \{0,1\}$) is the fewest number of clock cycles that are needed to justify the signal requirement (l,v) from l to fan-out s.

The i-controllability of line l $C_l(i)$ reflects the number of potential conflicts (or the probability to generate conflicts) or the number of clock cycles to justify the signal requirement (l,i) ($i \in \{0,1\}$). The easiest path for a fault effect propagation which is called EFEP for short is defined as the path by which the fault effect at this node can be propagated to primary outputs most easily. The easiest path here refers to the path whose observability is minimal. We have defined different observability for different fault effects (D and $\overline{D}$). D at a certain line denotes that the value of the line is 1 when there is no fault, while it is 0 when there is a fault; $\overline{D}$ at a certain line denotes that the value of the line is 0 when there is no fault, while it is 1 when there is a fault. The EFEP path of a node can be found in this way: if this node has only one successor, add its successor into its EFEP path, otherwise add the one whose observability is the minimal of its successors into its EFEP path. Continue this process till the primary output is reached, thus the EFEP path of the fault is established. We use v-observability $O_A(v)$ ($v \in \{D, \overline{D}\}$) to reflect the number of conflicts generated by the fault effect propagation along the EFEP path (or the probability to generate conflicts), or the number of clock cycles needed.

While calculating testability of a circuit, we should also calculate the inversion parity and sequential depths for testability of the lines and paths in the circuit.

Algorithm for calculation of inversion parity and sequential depth for testability:

(1) if line l is a branch of fan-out node s (or s'), here s' is a fan-out node successive to s, $$inv_v(l,s) = \begin{cases} 10 & \text{If } l \text{ is a branch of } s \\ inv_v(s', s) & \text{If } l \text{ is a branch of } s' \end{cases}$$

$$seq_v(l,s) = \begin{cases} 0 & \text{If } l \text{ is a branch of } s \\ seq_v(l, s') & \text{If } l \text{ is a branch of } s' \end{cases}$$

(2) if line l is the output of a NOT gate, and i is the input of it, here $v \in \{0,1\}$, $$inv_v(l,s) = \begin{cases} \overline{inv_v(i,s)} & \text{If } inv_v(i,s) = 10 \text{ or } 01 \\ inv_v(i,s) & \text{If } inv_v(i,s) = 00 \text{ or } 11 \end{cases}$$

$seq_v(l,s) = seq_{\overline{v}}(i,s)$ (3) if line l is the output of a flip-flop, and i is its input, here $v \in \{0,1\}$, $inv_v(l,s) = inv_v(i,s)$ $seq_v(l,s) = seq_v(i,s) + 1$ (4) if line l is the output of a AND gate or OR gate, and $i_1, i_2, \ldots i_n$ are its inputs, here $v_1$ is the output value of the gate when all the inputs are set to non-domination value, while $v_2$ is the output value of the gate when one of the inputs is set to domination value, $inv_{v1}(l,s) = inv_{v1}(i_1,s) \vee \ldots \vee inv_{v1}(i_n,s)$ here $\vee$ is the bitwise OR operation.

$inv_{v2}(l,s) = inv_{v2}(i,s)$ $seq_{v1}(l,s) = \max(seq_{v3}(i_1,s), \ldots, seq_{v3}(i_n,s))$ $seq_{v2}(l,s) = seq_{v4}(i,s)$ Here i is the input which can set the output l of the gate to $v_2$ mostly easily.

(5) If line l the output of a NAND gate of a NOR gate, and $i_1, i_2, \ldots i_n$ are its inputs, here $v_1, v_2 \in \{0,1\}$, $tem = inv_{\overline{v1}}(i_1,s) \vee \ldots \vee inv_{\overline{v1}}(i_n,s)$ $$inv_{v1}(l,s) = \begin{cases} \overline{tem} & \text{If } tem = 01 \text{ or } 10 \\ tem & \text{If } tem = 00 \text{ or } 11 \end{cases}$$

$inv_{v2}(l,s) = inv_{\overline{v2}}(i,s)$

Here i the input which can be set to domination value of the gate most easily in all the inputs. The calculation of $seq_v(l,s)$ is the same as that in 4).

We calculate the testability of the circuit in this way: first we calculate the controllability of the circuit. The controllability of line y in the circuit contains 0-controllability $C_y(0)$ and 1-controllability $C_y(1)$. We just consider a AND gate which has two inputs A and B and a output y, $C_y(0) = \min(C_A(0), C_B(0))$ $C_y(1) = C_A(1) + C_B(1) + p$ Here p=10*n, n is the number of fan-outs that meet the demand: if s is a fan-out, then $inv_1(A,s)! = inv_1(B,s)$, $inv_1(A,s)! = 0$, $inv_1(B,s)! = 0$ and $seq_1(A,s) = seq_1(B,s)$.

If y is the output of a OR gate whose inputs are A and B, $C_y(0) = C_A(0) + C_B(0) + p$ $C_y(1) = \min(C_A(1), C_B(1))$ The definition of p is the same as stated above.
If y is the output of a inverter whose input is i, $C_y(v) = C_i(\overline{v})$ Here $\bar{1}=0$, $\bar{0}=1$, $v\in\{0,1\}$.

As for a flip-flop whose input and output are i and y respectively, we use the following equation:

$$C_y(v)=C_i(v)+10 \ (v\in\{0,1\})$$

If the flip-flop is scanned, its output is fully controllable thus it can be thought of as a primary input. $C_y(v)=0(v\in\{0,1\})$.

The gates of other types can be dealt in the similar ways.

Then we should calculate the observability of the circuit. The calculation of observability is based on the assumption: the fault effect is propagated in the path in which it can be propagated most easily. We still use the concept of inversion parity to calculate observability. We consider the signal interdependence between two fanouts in the EFEP path. Inversion parity and sequential depth are two important factors for the analysis of potential conflicts.

Figure 4:
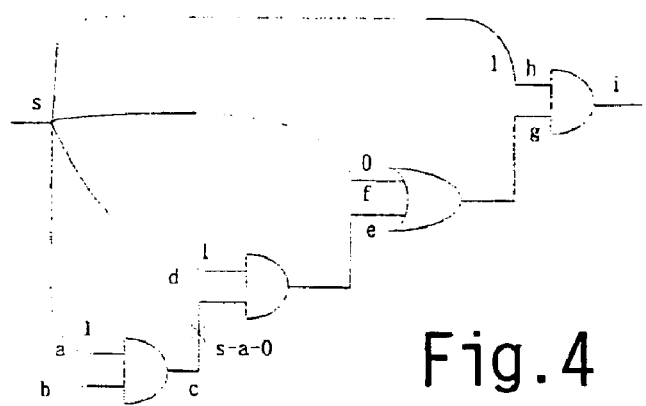
FIG. 4 is a diagram showing the conflict condition in the calculation of observability.

The method to calculate the observability is stated as follows:

If l is the primary output of a circuit, $O_l(v)=0$, $v\in\{D, \bar{D}\}$. We consider the fault effect propagated in the EFEP path. The potential conflicts will occur between the two adjacent fanouts. We noticed that the observability are calculated from outputs to inputs, thus it is possible to consider the conflicts in the calculation. As shown in FIG. 4, considering the stuct-at-0 fault (s-a-0) which is propagated along the path c-e-g-i, the signal requirements (a, 1), (d, 1), (f, 0) and (h, 1) may generate conflicts at the fan-out s. Using the concepts of inversion parity and sequential depth for testability, we can judge if a signal requirement generates conflicts with another one. In this way, we get the observability of signal line c:

$$O_c(v)=O_i(v)+C_d(l)+C_f(0)+C_h(l)+p$$

Here p=n*10, n is the number of potential conflicts when the fault effect is propagated from c to i. If l is the output of a flip-flop and i is the input of it, then $$O_i(v)=O_l(v)+10 v\in\{D, \bar{D}\}$$

If the flip-flop is scanned, its input is fully observable thus it can be handled as a primary output:

$$O_i(v)=0 v\in\{D, \bar{D}\}$$

(2) Selection of Partial Scan Flip-Flops

We can select the non-scan flip-flops according to the controllability and observability calculated in (1). For any flip-flop, if it is restored to non-scan state, it will influence the controllability and observability of its successors because it loses its own controllability and observability. The invention selects the flip-flop with the smallest influence as a non-scan flip-flop. The process to select non-scan flip-flops can be stated as follows:

a) Choose a scan flip-flop randomly, and the controllability of its output is 0 as well as the observability of its input is 0. Restore it to non-scan state (we call it candidate non-scan flip-flop), and now the v controllability ($v\in\{0,1\}$) of output comes up to the v controllability of input plus a value of 10 while the observability of input comes up to the observability of output plus a value of 10 (refer to the calculation method of controllability and observability described in (1)). Because the controllability and observability of the candidate non-scan flip-flop become worse, its successors' controllability and its predecessors' observability become worse too. We can trace the two kinds of changes, respectively. For any successor (e.g. flip-flop i) of the candidate non-scan flip-flop, we check the change of its controllability. If flip-flop i' controllability becomes worse, we record this flip-flop and the difference between its older controllability and the new one (the difference is recorded as $\Delta T_i$) to trace the change of its successors' controllability. If certain successor's controllability remains unchanged, we will not go on checking its own successors. According this selective tracing method, we can check all direct and indirect successors of the candidate non-scan flip-flop. Sum up all changes of controllability and take the total value as the candidate non-scan flip-flop's influence on controllability (GainC). As for lines with changed controllability, observability of the corresponding lines should also be updated. In the same way, we can get its influence on observability (GainO). Thus the candidate non-scan flip-flop i's influence (Gain(i)) in all is:

$$Gain(i)=GainC(i)+GainO(i)$$

b) Calculate all scan flip-flops' Gains according to the method described in a), then select the one whose Gain is the smallest, restore it to real non-scan state, and delete it from the set of scan flip-flops.

c) Calculate the circuit's testability again according to the method described in (1) and repeat step a) to select the next non-scan flip-flop until the number of non-scan flip-flops is equal to the expected one. To decide the number of non-scan flip-flops, we must consider the factor of fault coverage and area overhead.

(3) After the selection of non-scan flip-flops, we should construct the scan forest with the remaining scan flip-flops. Different from the full scan architecture, when two scan flip-flops converge in the circuit, we must check the numbers of non-scan flip-flops that they pass in there own converge paths respectively. If the two numbers are not equal, we can say that they do not converge with equal weight re-convergent fanouts and put them in the same group. In this way, we can reduce the test application time further.

(4) The test application scheme of partially scanned circuits is the same as that of full scan.

Compared to full scan method, partial scan method has the following advantages: it can reduce the area cost and test application time while keeping very good fault coverage (usually close to complete fault coverage).

Compute test application time, area overhead and test power consumption:

(1) Test Application Time

Assume that the number of scan flip-flops is n, the number of primary inputs is k, the number of groups is ngroup, the number of levels of scan forest is nlevel, and the total number of test patterns is #vectors, we have:

$$T=\text{\#vectors}\times(n\text{level}+1)+n\text{level}$$

Due to the configuration of scan forest, the test application time can be greatly reduced (here only nlevel+1 cycles). The advantage of the invention should be even clearer when the size of the circuit increases. In this case, test application time and test power consumption can be reduced to the level of non-scan design.

(2) Area Overhead

Synopsys standard cell library class.lib is adopted to estimate area overhead. Area overhead has two parts: (1) Area overhead because of scan flip-flop (1×n, where n is the number of scan flip-flops); (2) Another part of area overhead is due to the XOR trees, thus the area overhead of XOR-tree is (n−m)×3, where n is the number of scan flip-flops, m is the number of XOR-trees. Under full scan condition, the total area overhead is no more than 20% for all iscas89 benchmark circuits. As for partial scan, the area overhead can be reduced to be no more than 10%.

(3) Test Power Dissipation

When a circuit is tested, its circuitry will consume certain power supply, which is called test power dissipation. Test power dissipation can be classified into three separate categories: (1) The power due to transitions at scan flip-flops due to shifting the test patterns; (2) The transitions at the combinational part of the circuit due to shifting the test vectors. We shall present the method to estimate test power dissipation. For a combinational circuit, its node transition Count NTC is estimated as follows:

$$NTC = \Sigma N_G \times C_{load}$$

for all gates G wherein $N_G$ is the number of transitions occur at gate G, $C_{load}$ is the capacitance, which equals to the fanouts of combinational unit gates. If a transition occurs at the output of a flip-flop, a weight 6 is set for it; if not, a weight 2 is set for it. The test power reduction ratio depends on the number of necessary shifts to apply a test vector. The proposed scan forest architecture can greatly reduce test application time, and effectively reduce test power dissipation. As for the largest iscas89 benchmarks, the proposed scan forest architecture can reduce test power and test application cost to the level of non-scan design for testability.

Figure 5:
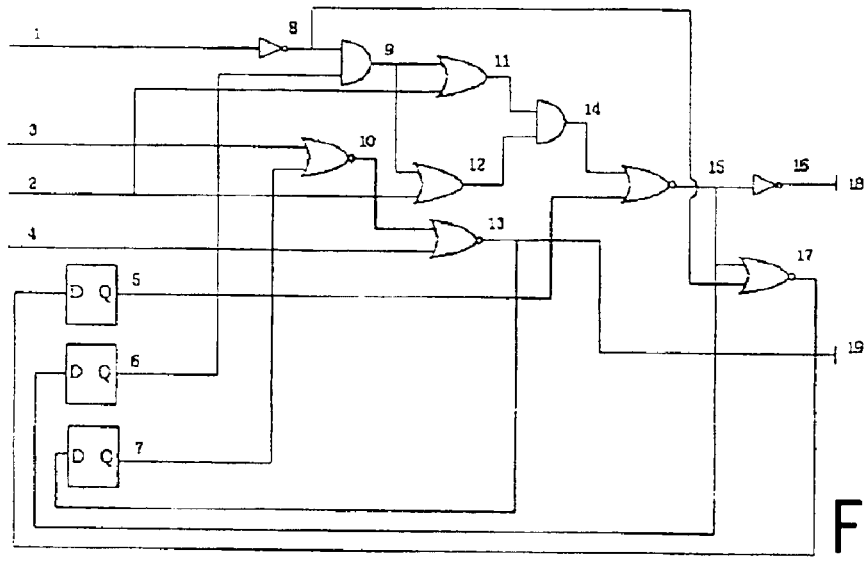
FIG. 5 is a specific original circuit (s27) before the implementation of the scan forest architecture.
Figure 6:
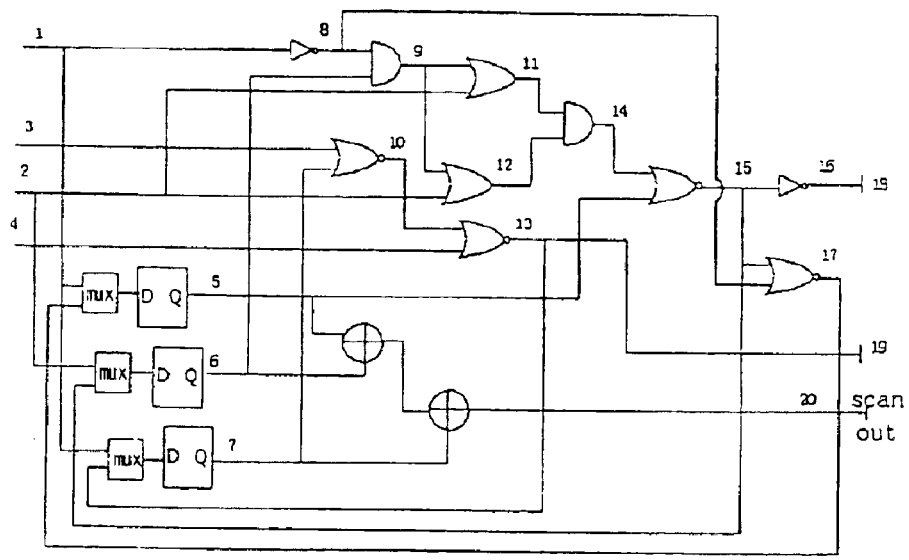
FIG. 6 is a new circuit after the full scan forest architecture is added into the circuit of FIG. 5 (s27).

A synchronous sequential circuit is shown in FIG. 5, where the successor sets for the scan flip-flops 5, 6, 7 are {15, 16, 17, 18}, {9, 11, 12, 14, 15, 16, 17, 18} and {10, 13, 19}. Note that flip-flop 5 and flip-flop 6 have the same successor unit 15, that is to say that they converge at a NOR gate 15, therefore they cannot be grouped into the same set. Nevertheless, flip-flop 7 does not converge with flip-flop 5 and flip-flop 6, so it is practical to group flip-flop 7 and flip-flop 5 together while flip-flop 6 in another group. The completed circuit is shown in FIG. 6. The scan-in signal of scan flip-flops 5 and 1 are driven by the primary input 1, and scan-in signal of scan flip-flop 6 is driven by the primary input 2. Now three scan flip-flops are in two different groups. All the flip-flops 5, 6, and 7 are leaf nodes, so they are all connected with the XOR-tree.

Now we begin test pattern generation for the circuit as shown in FIG. 6. This circuit is a full scan designed one, therefore, test generation of it can be simplified to that of a combinational circuit. Only one clock cycle is necessary to apply a test vector via the scan-in signals because there is only one level in the scan forest. In contrast, the full scan design which uses single chain configuration needs three clock cycles to load one single test pattern. That means the scan forest configuration really reduce test application time by about ⅔, and does not need additional scan-in signal.

Figure 7:
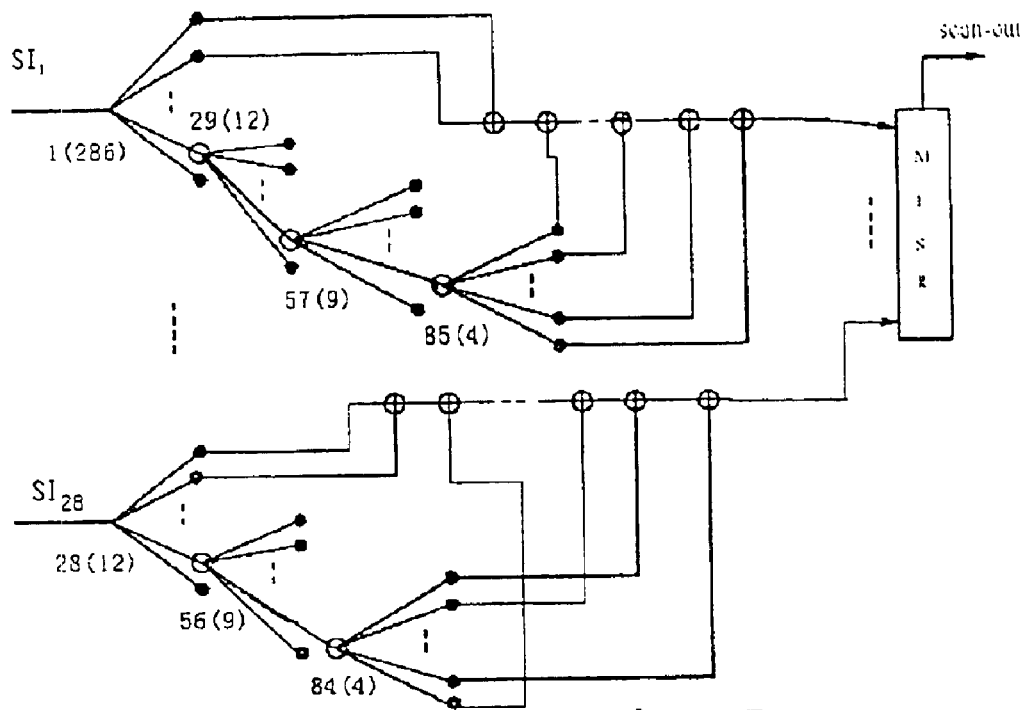
FIG. 7 is a sketch map of the full scan forest architecture of circuit s38417 according to another embodiment of the invention, wherein "●" denotes flip-flop at the leaf node and "○" denotes flip-flop at the internal node.

For larger circuit, the advantages of the scan forest design in the reduction of test application time, test power dissipation and pin overhead should be clearer. FIG. 7 shows the configuration after full scan forest design is performed. Note that group numbers are given at the root node of every tree, followed by the number of scan flip-flops in this group. After grouping the scan flip-flops, 1636 scan flip-flops in s38417 are grouped into 100 groups. There are four levels in this scan forest (100/28=4), since there are 28 primary inputs in s38417, which means that only four clock cycles is necessary to apply a test vector into all scan flip-flops. It is a more-than 99% reduction on test application cost compared with 1636 clock cycles in the full scan design with a single scan chain. Meanwhile, the test power reduction is also above 99%.

Figure 8:
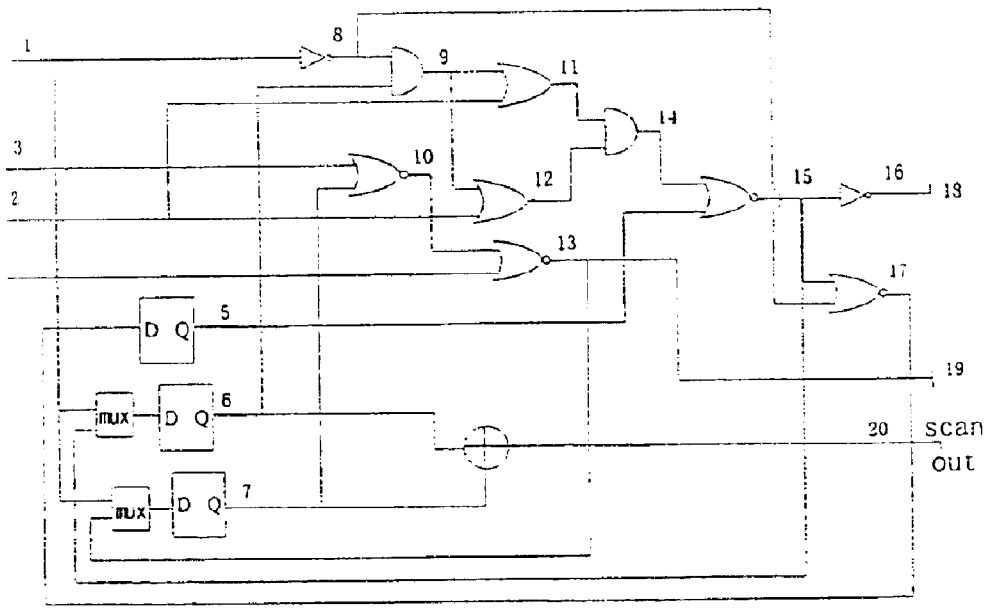
FIG. 8 is a new circuit after the partial scan forest architecture is added into the circuit as shown in FIG. 5 (s27).

The results for partial scan design are shown in FIG. 8. Then we restore every scan flip-flop to non-scan state one by one to find out their respective influence on testability of the circuit. After calculating the value of influence gain, it is found that flip-flop 5 has the least influence on testability if changed to non-scan flip-flop. So we select flip-flop 5 as non-scan flip-flop, while keeping 6 and 7 as scan flip-flops. It is found that they do not converge in the circuit, thus they can be put into one group. We connect flip-flop 6 and flip-flop 7 to primary input 1. Finally we connect the leaf nodes, flip-flop 6 and flop-flop 7 to the XOR-tree, and the output of the XOR gate is used as scan-out which is shown in FIG. 8. Test pattern generation is done on the circuit in FIG. 8, which leads to a fault coverage of 100% (the same as the full scan forest). Test application time is also the same as that of full scan forest, because the level of the scan forest does not change. However, the area overhead of partial scan forest design is reduced to about 60% of that of full scan forest, and test power consumption is also reduced by the same ratio.

Table 1 and table 2 show the test pattern generation results of ISCAS89 circuits with full scan forest implementation and partial scan forest implementation respectively. In the two tables, #FF denotes the number of flip-flops, FC denotes fault coverage (%), #HF denotes the number of hard-to-detect faults, vec denotes the number test patterns, tm denotes the ratio of test application cost (%) reduction of scan forest to that of single scan chain designed circuit, po denotes the number of extra output pins, ao denotes area overhead (%), and pw denotes the ratio (%) of test power dissipation of scan forest circuit to that of single scan chain circuit, sff in table 2 denotes the number of scan flip-flops in partial scan forest.

From table 1 we can see that, compared to single scan chain design, full scan forest design can reduce the test application time and test power dissipation while keeping the fault coverage not depressed. For larger circuits, the reduction of test application time and test power dissipation can extends to above 95%. After the XOR-tree is inserted, the FCs of most circuits keep in their previous levels except s35932 and s38417, but the area overhead remains a unsettled problem. With the proper use of partial scan forest, as shown in table 2, area overhead is reduced to be no more than 10% of original circuit, and the degradation of FC can be controlled to be trivial. The test application time and test power dissipation are also reduced to a great extent compared with fully scanned circuit with a single scan chain. It is clear that scan forest architecture can obtain complete fault coverage for almost all circuits and reduces the test application cost and test power consumption to non-scan design level.

Thus, a cost-effective scan architecture and a test application scheme for scan testing with non-scan test power and test application cost have been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method for scan design architecture with non-scan testing cost, said method comprising:

transforming a plurality of sequential cells for a sequential circuit to a plurality of controllable and observable cells for a combinational circuit;

connecting said plurality of sequential cells with at least one shifter registers;

obtaining at least one scan chains;

substituting an auto test pattern generation (ATPG) step for said sequential circuit with an ATPG for said combinational circuit;

providing a scan forest architecture wherein each sequential cell (scan flip-flop) is a node;

using primary inputs ($SI_1 \ldots SI_k$) of said sequential circuit as root nodes of scan trees in the scan forest thus said root nodes work as scan-in signals to load test vectors when the sequential circuit is under test mode;

connecting one group of the scan flip-flops to each primary input according to the principle that every two scan flip-flops in the same group do not converge in a circuit structure;

forming a first level of the scan forest by the groups of the scan flip-flops;

selecting a certain scan flip-flop for each group of the first level to be a predecessor of one group of the next level; and repeating the above steps until all scan flip-flops are connected with the scan forest.

2. A method for scan design architecture with non-scan testing cost, said method comprising:

transforming a plurality of sequential cells for a sequential circuit to a plurality of controllable and observable cells for a combinational circuit;

connecting said plurality of sequential cells with at least one shifter register;

obtaining at least one scan chain;

substituting an auto test pattern generation (ATPG) step for said sequential circuit with an ATPG for said combinational circuit;

initially all scan flip-flops are not grouped and said scan flip-flops form a set F F={$f_1, f_2, \ldots, f_n$}) in initial state;

establishing a new empty group $G_i$;

randomly selecting a first scan flip-flop from F and add into $G_i$, which can be expressed as $G_i=\{f_i\}$, and delete $f_i$ from F;

selecting a second scan flip-flop in F and check if the second scan flip-flop converges in a circuit structure with the flip-flops in $G_i$;

adding the second flip-flop into $G_i$ and delete from F if none flip-flop in $G_i$ converges with the second flip-flop;

repeating the selecting and adding steps for every scan flip-flop in F one by one and forming a complete group $G_i$;

using the above method to form a new group $G_{i+1}$;

repeating the above process until all scan flip-flops in F have been added into a certain group thus the scan flip-flops are distributed to a set of groups;

constructing the scan forest with width priority, wherein:

if the number k of the primary inputs is larger than or equal to the number g of the scan flip-flop groups, randomly selecting g primary inputs and connect every primary inputs to a group of scan flip-flops; and if g is larger than k, randomly select k groups of scan flip-flops and connect the k groups to different primary inputs respectively, which forms a first level of the scan forest; selecting the k groups again from the remainder g–k groups and connect them to k different predecessors in the first level respectively (the k predecessors are k scan flip-flops that belong to k different groups in the first level), which forms a second level of the scan forest, repeating until connecting all the groups into the scan forest;

connecting all leaf nodes by XOR gates thus constructing one or more XOR trees; and transmitting scan-out signals to multiple input signature register (MISR) via outputs of the XOR trees.

3. A method for scan design architecture with non-scan testing cost, said method comprising:

transforming a plurality of sequential cells for a sequential circuit to a plurality of controllable and observable cells for a combinational circuit;

connecting said plurality of sequential cells with at least one shifter register;

obtaining at least one scan chain;

substituting an auto test pattern generation (ATPG) step for said sequential circuit with an ATPG for said combinational circuit; and loading a test pattern, wherein the loading comprises:

modifying the sequential circuit according to a scan forest and obtaining a scan design circuit after constructing the scan forest;

generating the test pattern for the scan design circuit with current test generation tool, wherein the length of the test pattern is equal to the value of the number of groups plus the number of primary inputs; and wherein for each certain group in the scan forest, there is a corresponding definite value (0 or 1) so that all scan flip-flops in the certain group are set to a definite value; and setting the scan design circuit to a test mode and loading the test pattern further comprising:

loading vectors for a last level of scan forest into a first level of flip-flops from the primary inputs at a first clock cycle;

loading vectors for a penultimate level of the scan forest into the first level of flip-flops from the primary inputs at a second clock cycle and the vectors in the first level being sent into the second level at the same time; and repeating the above process to set every flip-flop to a right value according to each flip-flop's respective position in the scan forest.

4. A method for scan design architecture with non-scan testing cost, said method comprising:

transforming a plurality of sequential cells for a sequential circuit to a plurality of controllable and observable cells for a combinational circuit;

connecting said plurality of sequential cells with at least one shifter register;

obtaining at least one scan chain;

substituting an auto test pattern generation (ATPG) step for said sequential circuit with an ATPG for said combinational circuit; and constructing a partial scan forest, wherein a part of flip-flops are transformed and added into the scan forest a fault coverage and test efficiency close to those of full scan design is obtained, wherein the constructing the partial scan forest comprises:

(1) randomly restoring one of the scan flip-flops to the non-scan state, and checking its direct successors; wherein:

if the direct successor's testability including controllability and observability has changed, recording the changing quantity of the successor's testability, and then check its successors;

repeating the above process until there is no successor whose testability changes or until the searching has reached the primary outputs; and adding up all the changing quantities of testability and take the sum as the incidence of the scan flip-flop;

(2) trying every scan flip-flop in the same way as stated in step (1), selecting the flip-flop whose incidence is minimal as the non-scan cell, and restoring it to non-scan state in circuit;

(3) selecting enough number of non-scan cells according to steps (1) and (2), and updating the testability of the circuit when a new non-scan cell is selected out; and (4) restoring all the flip-flops that have been selected out to non-scan state and delete them from the scan flip-flop set and constructing the scan forest with the remainder elements in the scan flip-flop set.

* * * * *